(12) United States Patent
Miyazawa

(10) Patent No.: US 6,566,954 B2
(45) Date of Patent: May 20, 2003

(54) HIGH FREQUENCY AMPLIFIER BIAS CIRCUIT, HIGH FREQUENCY POWER AMPLIFIER, AND COMMUNICATION DEVICE

(75) Inventor: Naoyuki Miyazawa, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/871,640

(22) Filed: Jun. 4, 2001

(65) Prior Publication Data

US 2001/0054933 A1 Dec. 27, 2001

(30) Foreign Application Priority Data

Jun. 27, 2000 (JP) ......... 2000-192836

(51) Int. Cl.[7] .............. H03G 3/30; H03F 3/04
(52) U.S. Cl. ............. 330/285; 330/296
(58) Field of Search ............. 330/285, 296, 330/261, 267, 273, 289

(56) References Cited

U.S. PATENT DOCUMENTS 3,906,386 A * 9/1975 Hongu et al. ........... 330/289
4,079,336 A * 3/1978 Gross ........... 330/296
5,352,992 A * 10/1994 Asazawa ........... 330/291
6,359,516 B1 * 3/2002 Luo et al. ........... 323/314
6,417,734 B1 * 7/2002 Luo et al. ........... 330/288

FOREIGN PATENT DOCUMENTS

| JP | 05-037256 | 2/1993 |
|---|---|---|
| JP | 06-095751 | 4/1994 |

* cited by examiner

Primary Examiner—Tuan T. Lam
(74) Attorney, Agent, or Firm—Staas & Halsey LLP

(57) ABSTRACT

In the high frequency amplifier bias circuit, an emitter-follower-transistor, which serves to supply a bias electric current corresponding to a control input voltage input from outside, is connected to a base of the transistor for amplification. The transistor for current control is connected in series to emitter of the transistor for bias supply, and bypasses electric current corresponding to the control input voltage. Electric current corresponding to the control input voltage flows through the first transistor for temperature compensation. Electric current corresponding to electric current flowing through the first transistor for temperature compensation flows through the transistor for current control.

31 Claims, 11 Drawing Sheets

| OUTPUT LEVEL OF DIGITAL LOGIC CIRCUIT | | OPERATIONAL STATE OF BIAS CIRCUIT | | OUTPUT POWER |
|---|---|---|---|---|
| OUTPUT 1 | OUTPUT 2 | BIAS CIRCUIT 1 | BIAS CIRCUIT 2 | |
| L | L | INVALID | INVALID | ZERO |
| L | H | INVALID | VALID | LOW |
| H | L | VALID | INVALID | |
| H | H | VALID | VALID | HIGH |

HIGH FREQUENCY AMPLIFIER BIAS CIRCUIT, HIGH FREQUENCY POWER AMPLIFIER, AND COMMUNICATION DEVICE

FIELD OF THE INVENTION

The present invention relates to a high frequency amplifier bias circuit which uses a hetero junction bipolar transistor ("HBT") such as InGaP/GaAs type or the like, a high frequency power amplifier which uses the bias circuit, and a communication device which uses the high frequency power amplifier. More particularly, this invention relates to a high frequency power amplifier which carries out output power control such as in CDMA (code division multiple access) system.

BACKGROUND OF THE INVENTION

High frequency power amplifiers used in cellular phones or the like require even higher efficiency in order to simultaneously achieve the objects of making the battery more compact and more lightweight and enabling long duration of calls. Therefore, in a high frequency power amplifier which corresponds to a digital modulation system, high linearity is needed. In order to realize, at a low cost, a high frequency power amplifier which satisfies this demand, development of a small module which contains a transistor and passive components, and an MMIC (Microwave Monolithic IC) in which a transistor and passive components are provided on the same semiconductor substrate, has been carried out actively. Moreover, in order to reduce the number of components, integration, such as incorporating a bias circuit for supplying voltage or electric current to a transistor for amplification in an MMIC, has advanced.

FIG. 1 is a circuit diagram which illustrates a high frequency power amplifier using therein a conventional emitter-follower-transistor type constant voltage source bias circuit. As shown in FIG. 1, in this high frequency power amplifier that uses a bipolar transistor, emitter-follower-transistor 12 is used as a voltage source for supplying a base electric current to the transistor 11 for amplification ("transistor 11"). Further, transistors 13 and 14 are provided in order to eliminate fluctuations, due to temperature, of voltage between base and emitter of the transistor 11 ("VBE voltage") and the VBE voltage of the emitter-follower-transistor 12. The transistors 13 and 14 are provided in two stages.

Collector of the emitter-follower-transistor 12 is connected to the power source terminal 15. Emitter of the emitter-follower-transistor 12 is grounded via the resistor 16. Base of the emitter-follower-transistor 12 is connected, via the resistor 17, to the control input terminal 18 to which a control signal is supplied from the outside. Base of the transistor 11 is connected, via the resistor 10, to the node of the emitter of the emitter-follower-transistor 12 and the resistor 16.

The resistor 16 provides an electric current, which has an amplitude equal to about 1.3 V (VBE voltage of the transistor) divided by the resistance of the resistor 16, to the emitter-follower-transistor 12. Thus, the electric current which provided by the resistor 16 to the emitter-follower-transistor 12 is hardly dependent on the control signal. The emitter of the transistor 11 is grounded, the base is connected to an input terminal 111, and the collector is connected to an output terminal 112 of the high frequency power amplifier via a not shown matching circuit.

The collector of the transistor 14 for temperature compensation for the emitter-follower-transistor 12 is connected to the power source terminal 15. The emitter of the transistor 14 is grounded via the resistor 19, and is also connected to the base of the transistor 13 for temperature compensation for the transistor 11. Further, the base of the transistor 14 is, together with the collector of the transistor 13 for temperature compensation for the transistor 11, connected to the control input terminal 18 via the resistor 17. The emitter of the transistor 13 is grounded.

In general, in an amplifier which uses an HBT, in order to simultaneously realize both, high efficiency and high linearity, a bias point of the transistor must be set near Class B. Also, a bias point which fluctuates little must be provided. The inventor/s of this invention studied the relation between the bias electric current and the control input voltage into the control input terminal 18 for the bias circuit which is used in the conventional high frequency power amplifier shown in FIG. 1. The result of this study is shown as "conventional example" in FIG. 3.

As shown in FIG. 3, in the conventional bias circuit, the bias electric current changes substantially rectilinearly from 4 mA to 125 mA corresponding to the control input voltage between 2.5 V to 3.5 V. Therefore, for example, in order to make a bias electric current of 40 mA ±10% (i.e., 36 mA to 44 mA) flow, the control input voltage must be controlled to the extremely narrow range of 2.7 V ±0.03 V. In order to achieve this, a highly precise external circuit is needed. A highly precise external circuit is costly, therefore, there is a problem in that the cost of the entire device increases.

In the conventional bias circuit shown in FIG. 1, as shown in FIG. 3, if due to some reason the control input voltage increases from the reference voltage 2.7 V to 3.5 V which is the power source voltage, the bias electric current exceeds 120 mA. Therefore, generation of heat is promoted, and breaking due to the overcurrent caused thereby occurs. A technology for preventing such a breakage due to thermorunaway is known. A protection circuit such as an electric current cutoff circuit may be provided at the collector side of the transistor 11 (for example, see Japanese Patent Application Laid-Open (JP-A) No. 6-95751 or Japanese Patent Application Laid-Open (JP-A) No. 5-37256).

In such a protection circuit, a resistor is connected to the collector of the transistor 11, and the output electric current of the transistor 11 is controlled on the basis of the output electric current value of the transistor 11 which is sensed by the resistor or a bias electric current value which is supplied to the transistor 11.

However, if the protection circuit is provided, voltage drop occurs at the resistor connected to the collector of the transistor 11 or at the electric current cutoff circuit. Therefore, there is a problem in that the value of the power source voltage which is applied to the transistor 11 effectively decreases. Moreover, there is a problem in that a part of the RF power is consumed due to a loss component of the electric current cutoff circuit or the resistor for electric current detection, and the power added efficiency of the amplifier deteriorates.

In addition, in order to prevent the power source circuit side from being unstable and oscillating due to leakage of the RF output, a capacitor of an order of several $\mu F$ for bypassing the leakage of the RF output is applied to the electric current cutoff circuit. The response speed of the cutoff circuit is limited by a time constant of the capacitor. Therefore, it is difficult to make the response speed of the cutoff circuit sufficiently fast with respect to the speed of progression of the thermorunaway, and a problem arises in that the thermorunaway cannot be prevented effectively.

Moreover, in the conventional bias circuit shown in FIG. 1, there is a problem in that it is difficult to completely suppress fluctuations in the bias electric current when the temperature changes. Results obtained by studies of the present inventor on the relation between the temperature and the bias electric current, for the bias circuit which is used in the conventional high frequency power amplifier shown in FIG. 1, are shown as a conventional example in FIG. 4. In the high frequency power amplifier which is shown in FIG. 1, the temperature change of the bias electric current of the transistor 11 is expressed by following equation (1).

$$\Delta J11/\Delta Tj = \Delta J14/\Delta Tj + \Delta J13/\Delta Tj - \Delta J12/\Delta Tj \qquad (1)$$

In equation (1), $\Delta J14/\Delta Tj$, $\Delta J13/\Delta Tj$, $\Delta J12/\Delta Tj$, and $\Delta J11/\Delta Tj$ are the temperature changes of electric current density of the transistors 14, 13, 12, 11, respectively. Here, $\Delta J14/\Delta Tj$ is a substantially constant value which is determined by the resistor 19 and approximately 1.3 V of the VBE voltage of the transistor, and $\Delta J14/\Delta Tj=0$. Similarly, $\Delta J12/\Delta Tj$ is a substantially constant value which is determined by the resistor 16 and approximately 1.3 V of the VBE voltage, and $\Delta J12/\Delta Tj=0$. $\Delta J13/\Delta Tj$ is the temperature change of the electric current density, which is equal to a value obtained by dividing, by the resistor 17, a difference between the control input voltage and approximately 2.6 V which corresponds to the two-stage VBE voltage.

To simplify explanation, in the above description, the VBE voltage is approximately 1.3 V. However, strictly speaking, due to the physical characteristics of the device, the VBE voltage also varies in accordance with the temperature. As an example, if the same electric current is made to flow, the VBE voltage which is 1.30 V at room temperature changes to 1.34 V at a temperature lower than room temperature, and to 1.26 V at a temperature higher than room temperature.

Due to the trend toward low voltage operation in communication devices in recent years, the control input voltage tends to be set low, for example, to 2.7 V. Therefore, the voltage which is applied to the resistor 17 is 0.10 V (2.7 V−1.30 V×2) at room temperature, and is 0.02 V (2.7 V−1.34 V×2) at a temperature lower than room temperature, and is 0.18 V (2.7 V−1.26 V×2) at a temperature higher than room temperature. Namely, the effect of the temperature changes of the VBE voltage with respect to the voltage which is applied to the resistor 17 cannot be relatively ignored.

As described above, in the case of low voltage control such as a control input voltage of 2.7 V, the voltage which is applied to the resistor 17 increases at a high temperature. Therefore, there is a positive temperature coefficient of $\Delta J13/\Delta Tj=K$. Accordingly, a electric current change $\Delta J11/\Delta Tj$ of the transistor for amplification is K ($\Delta J11/\Delta Tj=K$) in accordance with above equation (1), and there is a problem in that it is easy for variations in characteristics at the time of the temperature changes or thermorunaway at the time of high temperatures to occur in the conventional amplifier.

SUMMARY OF THE INVENTION

It is an object of the present invention is to provide a high frequency amplifier bias circuit in which sensitivity of bias electric current of an amplifier with respect to changes in a control input voltage input into the high frequency amplifier bias circuit is lowered, limiting of electric current with respect to bias electric current is realized without providing a protecting circuit such as an electric current cutoff circuit at an output side of an amplifying transistor, and fluctuations of the bias electric current due to temperature change are made smaller. It is also an object of this invention to provide a high frequency power amplifier that uses the bias circuit according to the present invention. It is also an object of this invention to provide a communication device that uses the amplifier according to the present invention.

In the high frequency amplifier bias circuit according to the present invention, an emitter-follower-transistor, which serves as a transistor for bias supply which supplies bias electric current corresponding to a control input voltage from an exterior, is connected to a base of a transistor for amplification. The transistor for limiting electric current is serially connected to the emitter of the emitter-follower-transistor. The electric current which corresponds to the control signal is by passed by the transistor for limiting electric current.

The high frequency power amplifier according to the present invention uses the above-mentioned bias circuit.

The communication device according to the present invention uses the above-mentioned amplifier.

Other objects and features of this invention will become apparent from the following description with reference to the accompanying drawings.

DESCRIPTION OF THE PREFERRED EMBODIMENTS

Preferred embodiments of the present invention will be described in detail with reference to the accompanying drawings.

Figure 2:
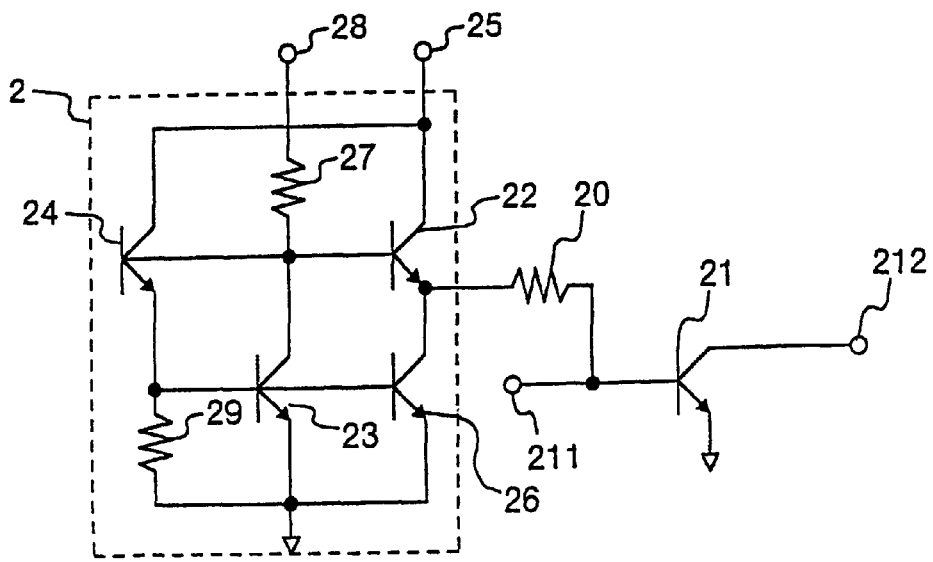
FIG. 2 is a circuit diagram which illustrates a structure of a high frequency power amplifier that uses a high frequency amplifier bias circuit according to a first embodiment of the present invention.

FIG. 2 is a circuit diagram which illustrates the structure of a high frequency power amplifier that uses a high frequency amplifier bias circuit according to a first embodiment of the present invention. The high frequency amplifier bias circuit 2 includes the transistor 22 for supplying bias ("transistor 22") which is of emitter-follower-transistor type, the transistor 26 for limiting electric current ("transistor 26"), the first transistor 24 for temperature compensation ("transistor 24"), the second transistor 23 for temperature compensation ("transistor 23"), and two resistors 27, 29. These four transistors 22, 26, 24, 23, and the transistor 21 for amplification ("transistor 21") connected to the bias circuit 2 via a resistor 20, are not particularly limited, and are, for example, bipolar type transistors such as HBTs or the like.

Collector of the transistor 22 is connected to the power source terminal 25. Emitter of the transistor 22 is connected to the collector of the transistor 26 and to one terminal of the resistor 20. Base of the transistor 22, together with the base of the first transistor 24 and the collector of the second transistor 23, are commonly connected, via the resistor 27, to the (first) control input terminal 28 to which a control input voltage is supplied as a control signal from the exterior.

The emitter of the transistor 26 for limiting electric current, together with the emitter of the second transistor 23, are grounded. The base of the transistor 26, together with the base of the second transistor 23, are connected to the emitter of the first transistor 24. The collector of the first transistor 24 is connected to the power source terminal 25. The emitter of the first transistor 24 is grounded via the resistor 29.

The base, which is a bias input section, of the transistor 21 is connected to an input terminal 211 of the high frequency power amplifier via another terminal of the resistor 20 and a not shown matching circuit. The emitter of the transistor 21 is grounded. The collector of the transistor 21 is connected to an output terminal 212 of the high frequency power amplifier via a matching circuit which is not illustrated.

Operation of the high frequency amplifier bias circuit 2 will now be explained. In the high frequency amplifier bias circuit 2, the first and second transistors 24 and 23 for temperature compensation, which are provided in two stages, work to offset temperature changes of a voltage between a base and an emitter (hereinafter, referred to as "VBE voltage") of the transistor 21 and the VBE voltage of the transistor 22.

Electric current, which corresponds to the control input voltage supplied to the (first) control input terminal 28, flows to the transistor 22. Further, electric current, which corresponds to the control input voltage supplied to the (first) control input terminal 28, flows to the first transistor 24. Electric current, which corresponds to the emitter voltage of the first transistor 24, flows to the second transistor 23. Electric current, which is proportional to the electric current which flows to the second transistor 23, flows to the transistor 26.

Figure 1:
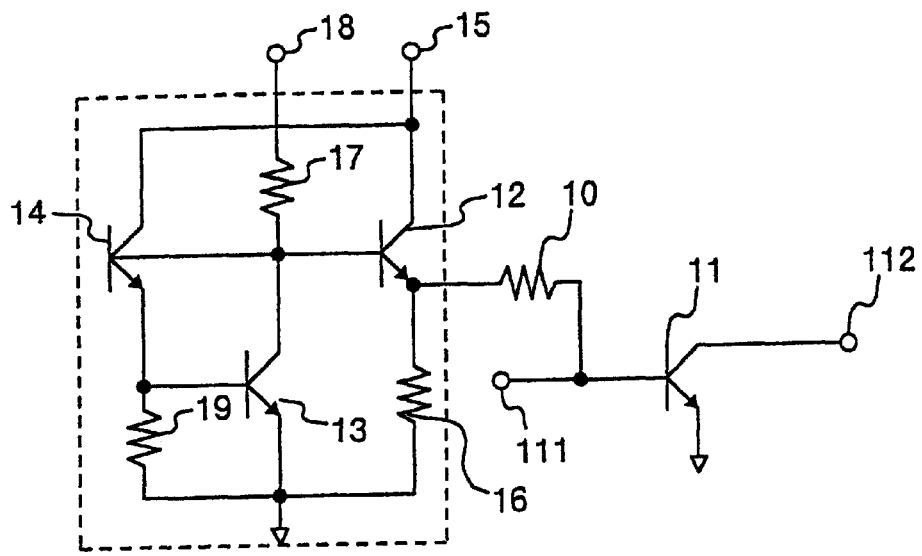
FIG. 1 is a circuit diagram which illustrates a high frequency power amplifier that uses a conventional emitter-follower-transistor type constant voltage source bias circuit.
Figure 3:
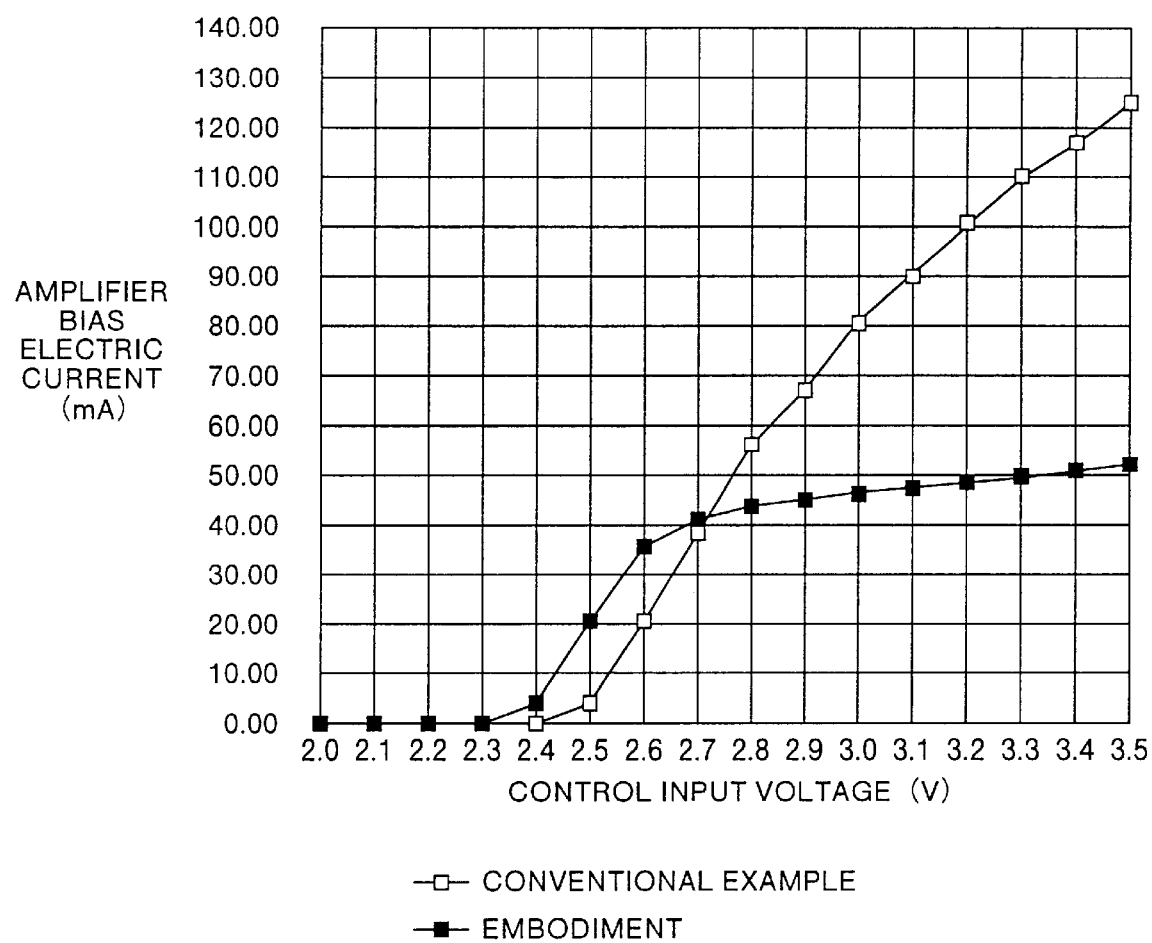
FIG. 3 is a characteristic graph which shows a relation between a control input voltage and a bias electric current for the high frequency amplifier bias circuit according to the first embodiment of the present invention and a conventional high frequency amplifier bias circuit.

The electric current, which flows to the transistor 22 in proportion to the increase in the control input voltage, is greater than the same in the conventional bias circuit shown in FIG. 1, and the VBE voltage of the transistor 22 increases more vigorously than in the conventional art. As a result, the base voltage which is applied to the transistor 21 is limited to less than or equal to a given constant value. Therefore, as shown in FIG. 3 as the "embodiment", even if the control input voltage increases, the bias electric current is limited to be less than or equal to a constant value. Here, in order to achieve a great electric current limiting effect by a small control input electric current, the size of the transistor 26 may be made larger than that of the second transistor 23.

In the circuit shown in FIG. 2, given that the temperature changes of the electric current densities of the first transistor 24, the second transistor 23, and the transistor 22 are respectively $\Delta J24/\Delta Tj$, $\Delta J23/\Delta Tj$, and $\Delta J22/\Delta Tj$, in the same way as with the conventional circuit, the temperature change $\Delta J21/\Delta Tj$ of the bias electric current of the transistor 21 is expressed by following equation (2).

$$\Delta J21/\Delta Tj = \Delta J24/\Delta Tj + \Delta J23/\Delta Tj - \Delta J22/\Delta Tj \tag{2}$$

In equation (2), $\Delta J24/\Delta Tj$ is a substantially constant value which is determined by the resistor 29 and it is about 1.3 V of the VBE voltage of the transistor, and $\Delta J24/\Delta Tj=0$. $\Delta J23/\Delta Tj$ is the temperature change of the electric current density, which is a value obtained by dividing, by the resistor 27, a difference between the control input voltage and about 2.6 V which corresponds to the two stages of the VBE voltage, and as is the case with the conventional circuit, there is a positive temperature coefficient of $\Delta J23/\Delta Tj=K$. Here, the transistor 26 has the same temperature characteristic as the second transistor 23, where the base thereof is commonly connected.

Figure 4:
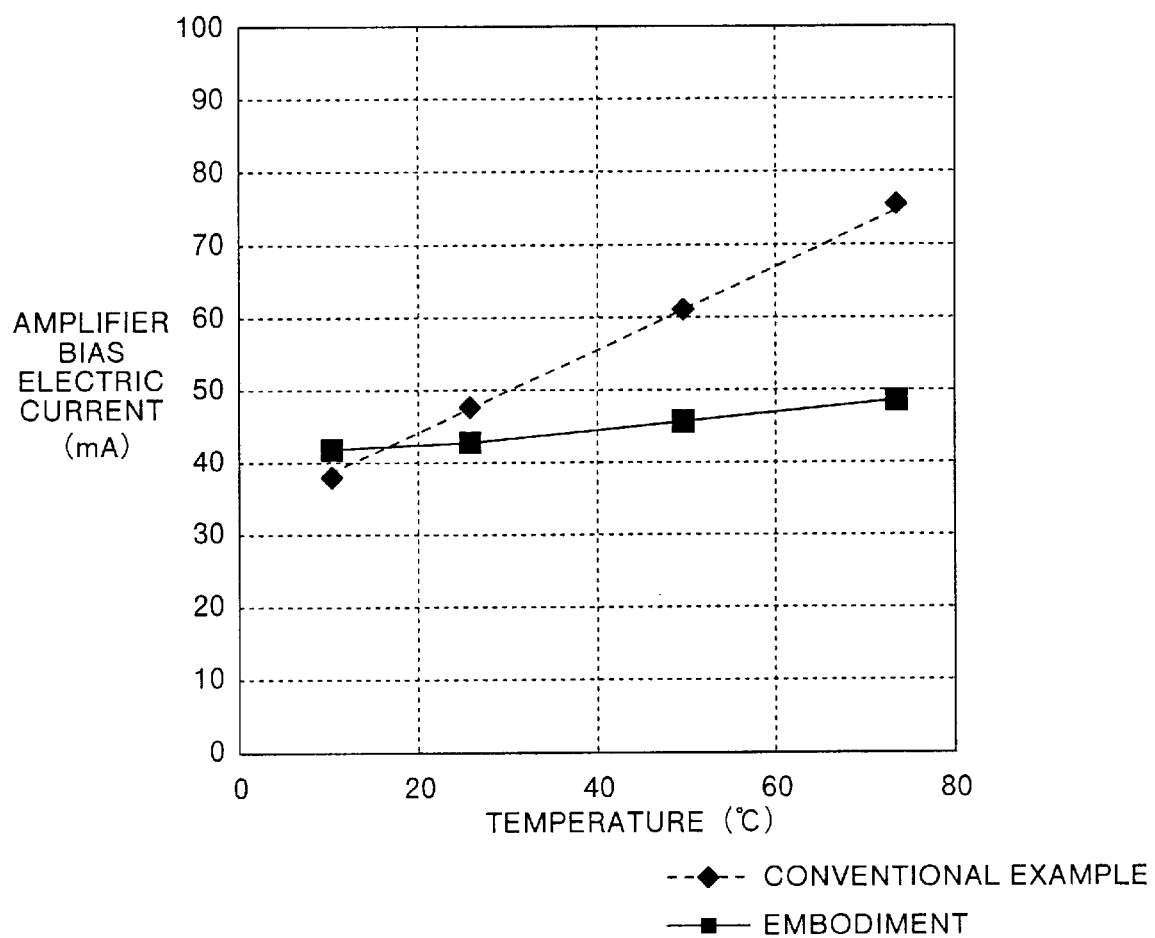
FIG. 4 is a characteristic graph which shows a relation between temperature and a bias electric current for the high frequency amplifier bias circuit according to the first embodiment of the present invention and the conventional high frequency amplifier bias circuit.

Therefore, the temperature change $\Delta J26/\Delta Tj$ of the electric current density of the transistor 26 is equal to $\Delta J23/\Delta Tj$, i.e., is K ($\Delta J26/\Delta Tj=\Delta J23/\Delta Tj=K$). Moreover, the transistor 22, in which the electric current is limited by the transistor 26, has the same temperature characteristic as the transistor 26, and $\Delta J22/\Delta Tj$ is equal to K ($\Delta J22/\Delta Tj=K$) Therefore, from the above equation (2), $\Delta J21/\Delta Tj$ is zero ($\Delta J21/\Delta Tj=0+K-K=0$), and it can be understood that the temperature change of the transistor 21 is completely offset. FIG. 4 shows the temperature characteristics of the bias electric current when the bias electric current at room temperature is set to 45 mA, which is substantially the same as in conventional example. As can be seen from FIG. 4, the fluctuation in the bias electric current at the time of a temperature change is smaller in the embodiment than in the conventional example.

According to the high frequency power amplifier of the first embodiment, because the transistor 26 is provided, an electric current limiting means for preventing breakdown due to overcurrent can be realized within the high frequency amplifier bias circuit 2. Therefore, there is no need to provide an electric current cutoff circuit or a resistor for electric current detection or the like at the output side of the transistor 21. As a result, deterioration in power added efficiency due to an electric current cutoff circuit or a resistor for electric current detection can be avoided. Moreover, even if the control input voltage increases, the bias electric current is limited to a constant value or less. Therefore, a bias electric current which is stable with respect to the fluctuations in the control input voltage can be obtained.

Moreover, even if the temperature changes, the bias electric current hardly changes. Therefore, an amplifier which is stable with respect to changes in the temperature can be obtained. Accordingly, a highly precise voltage source passing through a voltage regulator is not required, and the amplifier can be directly controlled by the output signal of the digital logic circuit. Thus, the design of the peripheral circuits of the amplifier can be simplified. Therefore, it is possible for portable communication devices to be made compact and lower cost.

Note that the high frequency amplifier bias circuit according to the present invention is not limited to the one described with reference FIG. 2. Various modifications to the structure shown in FIG. 2 are possible. For example, as in the bias circuit 3 shown in FIG. 5, the second control input terminal 31, resistor 32, and two transistors 33 and 34 for fine adjustment of electric current, may be added to the bias circuit 2 shown in FIG. 2. This bias circuit 3 will be described hereinafter.

The collector and the base of the first transistor 33 and the base of the second transistor 34 are commonly connected to the second control input terminal 31 via the resistor 32. The emitter of the first transistor 33 and the emitter of the second transistor 34 are grounded. The collector of second transistor 34 is connected to the emitter of the first transistor for temperature compensation 24, the base of the second transistor for temperature compensation 23, and the base of the transistor 26.

Figure 5:
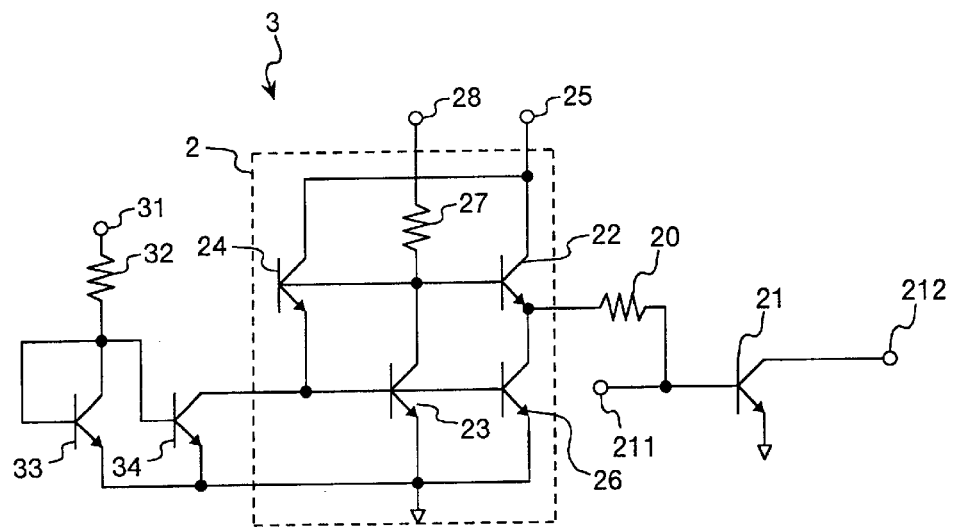
FIG. 5 is a circuit diagram which illustrates a structure of a high frequency power amplifier that uses a modified example of the high frequency amplifier bias circuit according to the first embodiment.
Figure 6:
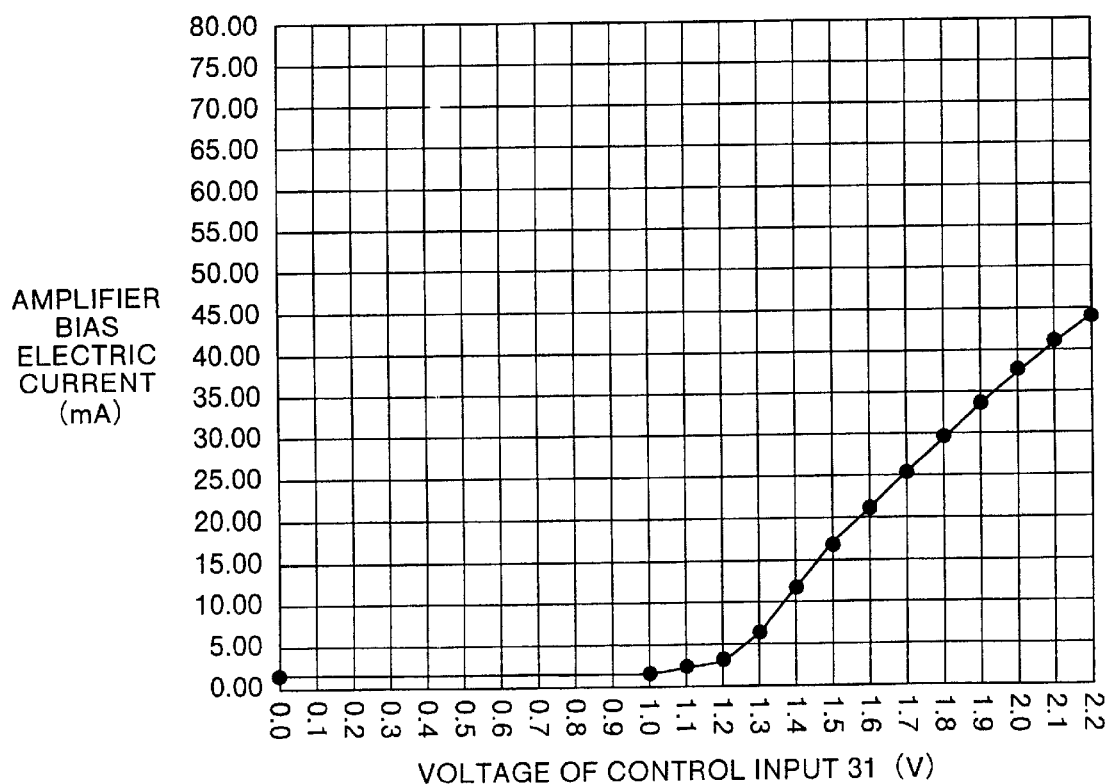
FIG. 6 is a characteristic graph which shows a relation between a control input voltage and a bias electric current for the high frequency amplifier bias circuit which is shown in FIG. 5.

According to the bias circuit shown in FIG. 5, as can be seen from the relation illustrated in FIG. 6 between the control input voltage and the bias electric current, the bias electric current can be rectilinearly changed by a control input voltage in wide range of, for example, from 1.3 V to 2.2 V, being applied to the second control input terminal 31. Therefore, a low precision voltage signal, such as the output signal of a logic circuit or the like, is input into a (first) control input terminal 28, and while the bias electric current is turned on and off on the basis of this input signal, the control input voltage of the second control input terminal 31 is adjusted when the bias electric current is on. In this way, fine adjustment of the bias electric current can be carried out.

In the first embodiment, the high frequency power amplifier is formed by an HBT. However, the present invention is not limited to the same, and the high frequency power amplifier may be formed by using a FET or HEMT transistor, i.e. a transistor other than the bipolar transistor.

Figure 7:
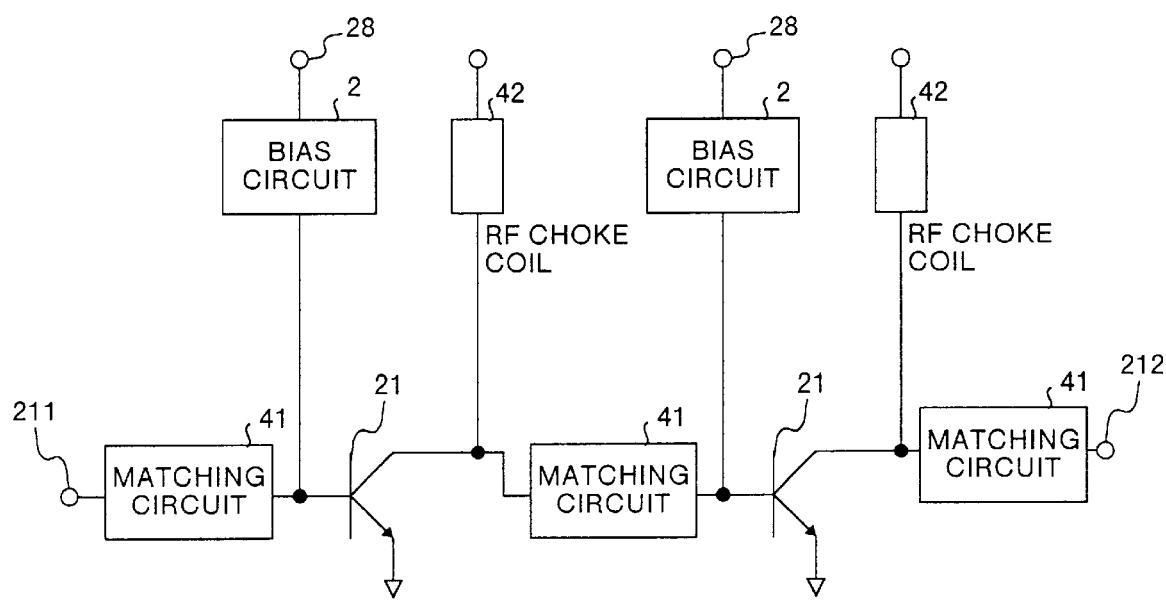
FIG. 7 is a block diagram which illustrates a structure of a high frequency power amplifier according to a second embodiment of the present invention.

FIG. 7 is a block diagram which illustrates a structure of a high frequency power amplifier according to a second embodiment of the present invention. This high frequency power amplifier is a two stage structure high frequency power amplifier which utilizes two bias circuits 2 (or bias circuits 3) of the first embodiment and two transistors 21 for amplification of the first embodiment. In FIG. 7 (and in FIG. 8 to FIG. 10, FIG. 12, and FIG. 13 referred later) reference numeral 41 denotes matching circuit/s, and reference numeral 42 denotes RF choke coil/s.

The bias circuit 2 (and the bias circuit 3) has the same structure as explained in connection to first embodiment, therefore, in this second embodiment (and in the third and the fourth embodiments referred later), description thereof is omitted. The bias circuits 2 and the transistors 21 are formed on the same semiconductor substrate. Moreover, the matching circuits 41 and the RF choke coils 42 may also be formed on the same substrate.

According to the high frequency power amplifier of the second embodiment, a two stage structure amplifier is obtained which is stable with respect to fluctuations of control input voltage and changes in temperature, and in which direct control by the output signal of a digital logic circuit is possible.

Figure 8:
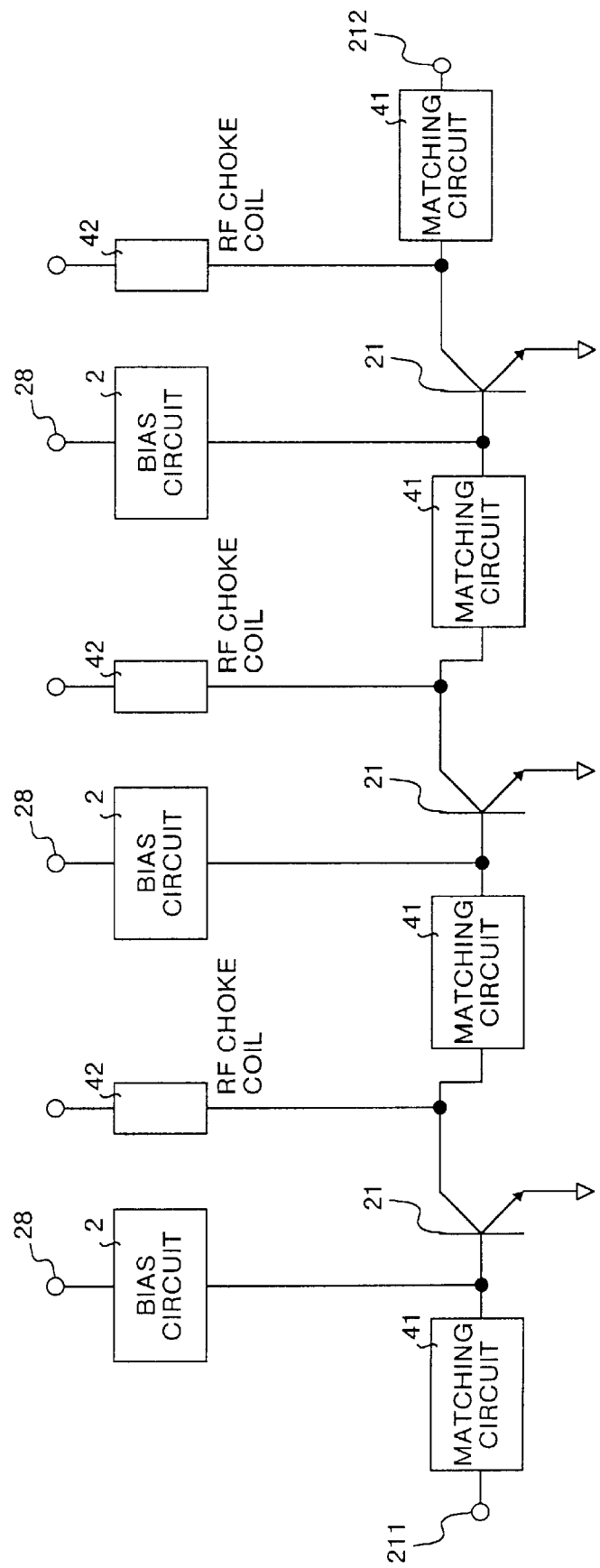
FIG. 8 is a block diagram which illustrates a structure of a high frequency power amplifier according to a third embodiment of the present invention.

FIG. 8 is a block diagram which illustrates the structure of a high frequency power amplifier according to a third embodiment of the present invention. This high frequency power amplifier is a three stage structure high frequency power amplifier which utilizes three bias circuits 2 (or bias circuits 3) and three transistors 21 for amplification of the first embodiment. The bias circuits 2 and the transistors 21 are formed on the same semiconductor substrate. Moreover, the matching circuits 41 and the RF choke coils 42 may be formed on the same substrate.

According to the high frequency power amplifier of the third embodiment, a three stage structure amplifier is obtained which is stable with respect to fluctuations of control input voltage and changes in temperature, and in which direct control by the output signal of a digital logic circuit is possible.

Figure 9:
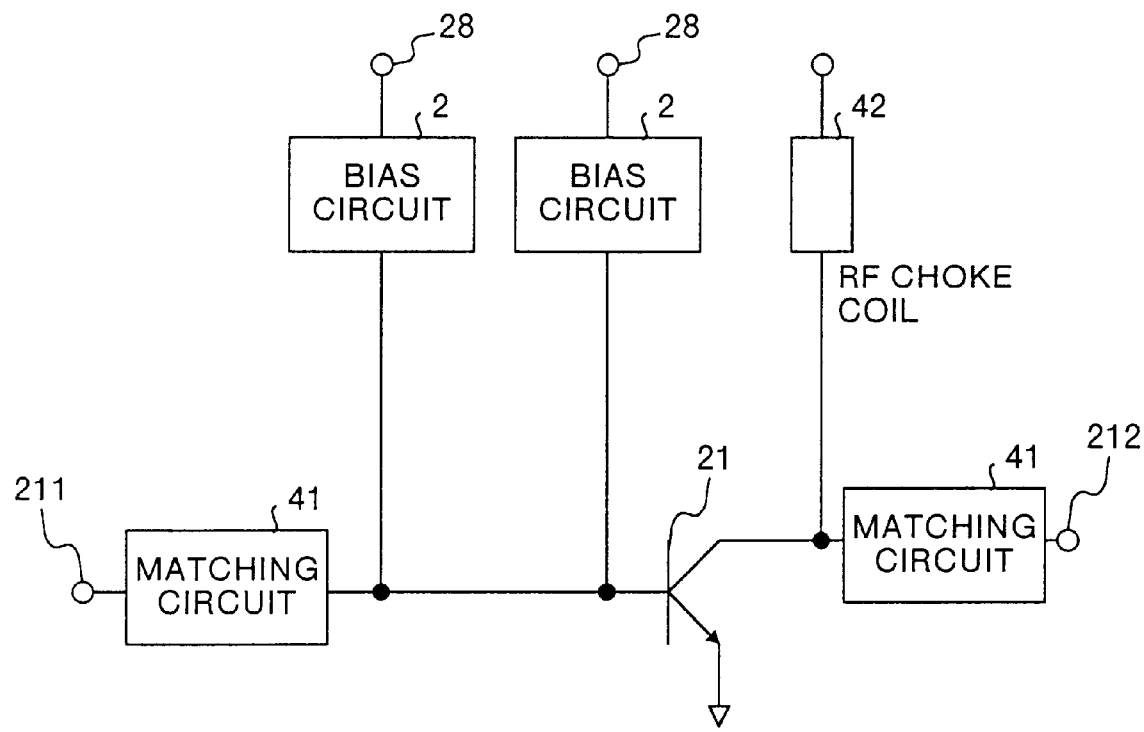
FIG. 9 is a block diagram which illustrates a structure of a high frequency power amplifier according to a fourth embodiment of the present invention.

FIG. 9 is a block diagram which illustrates a structure of a high frequency power amplifier according to a fourth embodiment of the present invention. In this high frequency power amplifier, two bias circuits 2 (or two bias circuits 3) are connected in parallel to the base of one transistor 21 for amplification of the first embodiment. The two bias circuits 2 can be independently controlled by control input voltages which are applied to the respective control input terminals 28 thereof. The bias circuits 2 and the transistors 21 are formed on the same semiconductor substrate. Moreover, the matching circuits 41 and the RF choke coils 42 may be formed on the same substrate.

Figures 10, 11:
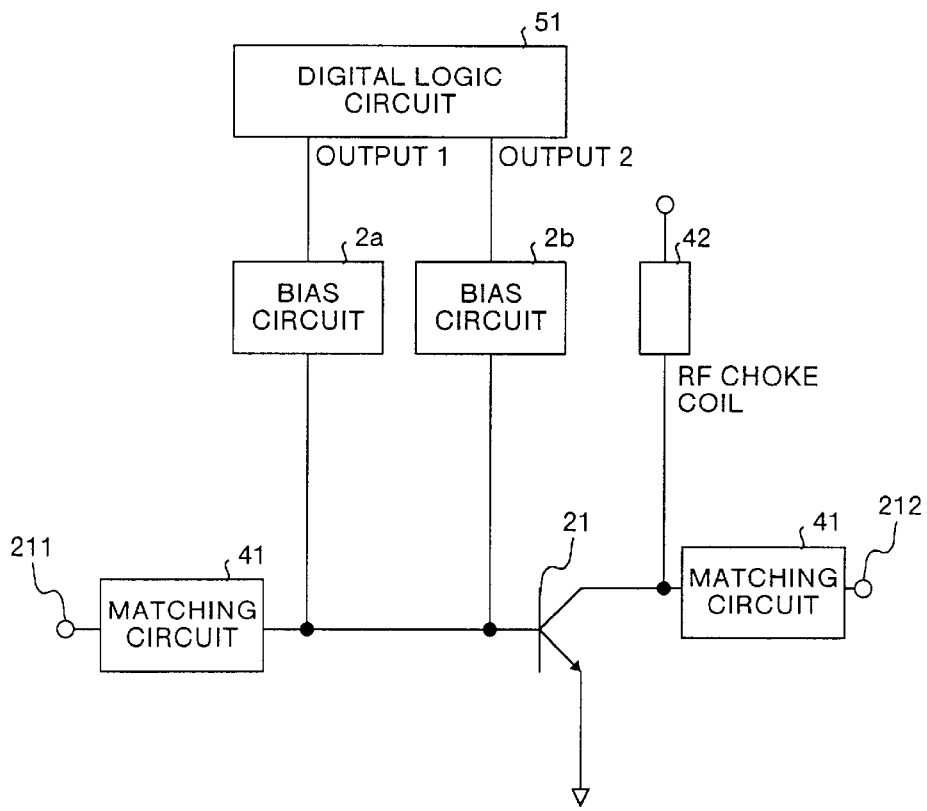
FIG. 10 is a block diagram which illustrates a structure of an example in which the high frequency power amplifier according to the fourth embodiment of the present invention is controlled by an output signal of a digital logic circuit.
FIG. 11 is a table which shows a relation between levels of the output signals of the digital logic circuit and operational states of the bias circuit and output power, for the structure shown in FIG. 10.

For example, as shown in FIG. 10, two bias circuits 2a and 2b may be controlled by two output signals (digital signals) which are output from a digital logic circuit 51. The relations between the levels of the two output signals (output 1 and output 2) of the digital logic circuit 51, and the operational states of the two bias circuits (bias circuit 1 and bias circuit 2) 2a, 2b, and the output powers, are shown in FIG. 11.

In accordance with the example shown in FIG. 11, for example, when both the output 1 and the output 2 are at low logical level ("L level"), the bias circuit 1 and the bias circuit 2 are not operated, and therefore, the bias electric current is "zero". Moreover, when one of the output 1 and the output 2 is at high logical level ("H level"), only the bias circuit 1 (or the bias circuit 2) which corresponds thereto is operated, and therefore, the bias electric current is "low". When the both the output 1 and the output 2 are H level, both the bias circuit 1 and the bias circuit 2 are operated, and therefore, the bias electric current is "high".

According to the high frequency power amplifier of the fourth embodiment, when the output power of the amplifier is low, only one of the bias circuits 2 (or the bias circuits 3) is operated, and when the output power approaches a maximum value, the other bias circuit 2 is operated. Namely, since both the bias circuits are operated, a large amount of bias electric current can be made to flow at the time of maximum power. Therefore, when the output power is low, the bias electric current can be suppressed, and the power added efficiency of the amplifier can be increased. Moreover, when the output power is high, the linearity of the amplifier can be improved by making a large amount of the bias electric current flow.

Note that, three or more bias circuits 2 (or bias circuits 3) may be connected in parallel, and the bias circuits 2 can be successively operated in accordance with an increase in the output power. Therefore, the bias electric current can be set even more finely.

Figure 12:
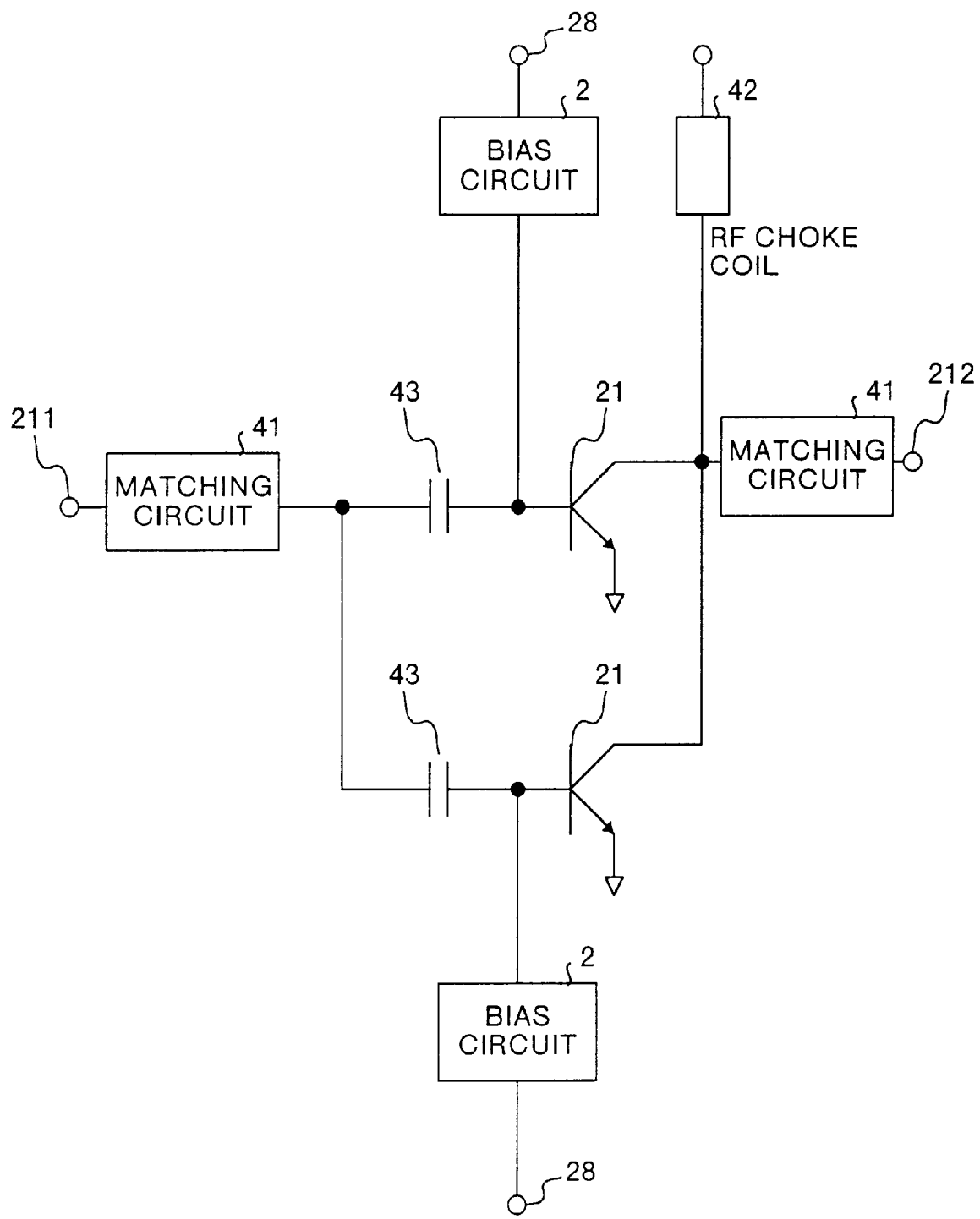
FIG. 12 is a block diagram which illustrates a structure of a high frequency power amplifier according to a fifth embodiment of the present invention.

FIG. 12 is a block diagram which illustrates a structure of a high frequency power amplifier according to a fifth embodiment of the present invention. In this high frequency power amplifier, two sets of circuits are connected in parallel between the input terminal 211 and the output terminal 212 of the high frequency power amplifier. Each set of the circuit includes capacitor 43, and an amplifier in which one bias circuit 2 (or bias circuit 3) is connected to the base of one transistor 21 for amplification of the first embodiment.

The two bias circuits 2 can be independently controlled by control input voltages which are applied to the respective control input terminals 28 thereof. The bias circuits 2 and the transistors 21 are formed on the same semiconductor substrate. Moreover, the matching circuits 41, the RF choke coil 42, and the capacitors 43 may be formed on the same substrate.

Figure 13:
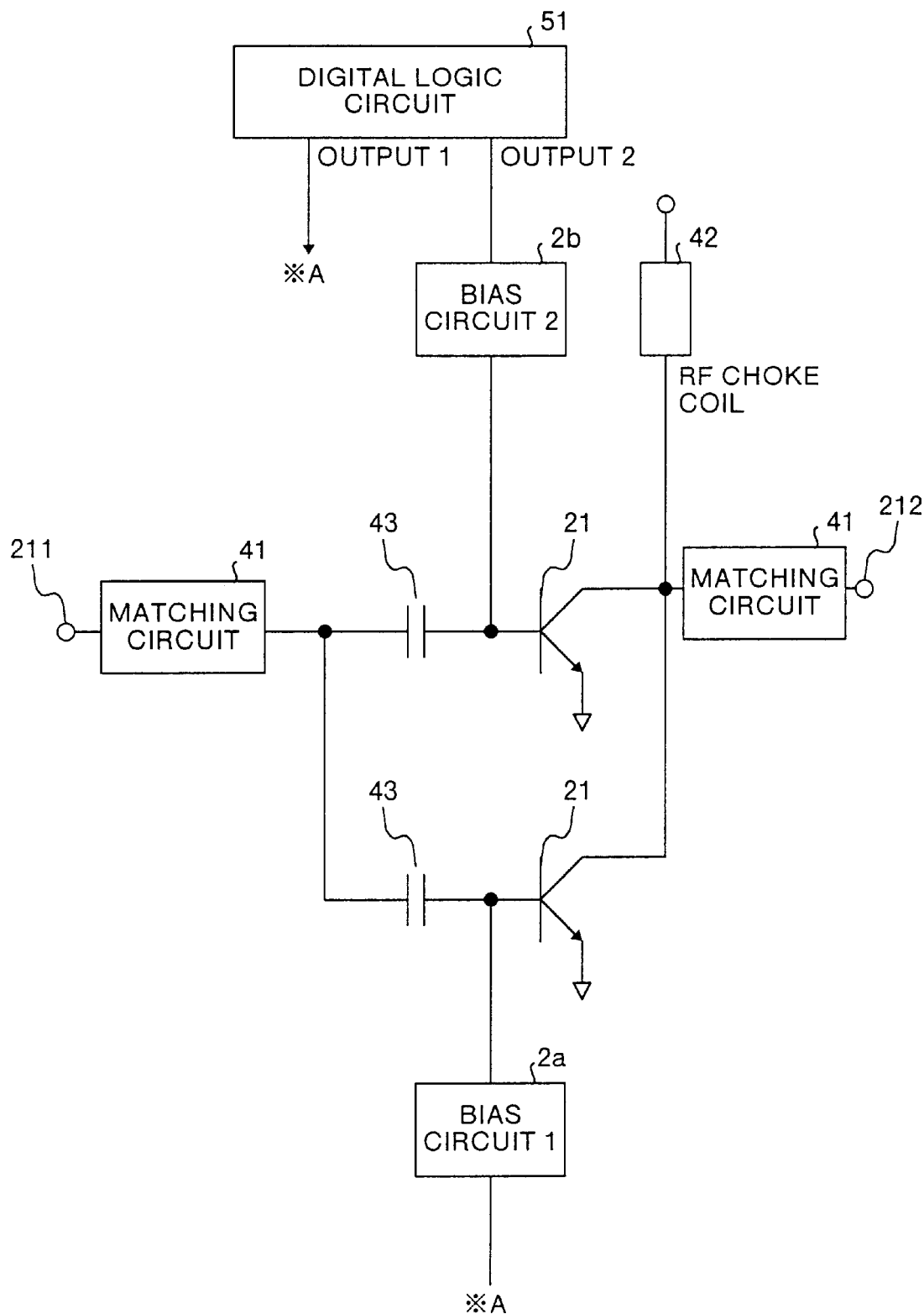
FIG. 13 is a block diagram which illustrates a structure of an example in which the high frequency power amplifier according to the fifth embodiment of the present invention is controlled by a output signal of a digital logic circuit.

In the fifth embodiment, in the same way as in the fourth embodiment, as shown in FIG. 13, two bias circuits 2a, 2b may be controlled by two output signals (digital signals) which are output from the digital logic circuit 51. The relation between the levels of the two output signals (output 1 and output 2) of the digital logic circuit 51, and the operational states of the two bias circuits (the bias circuit 1 and the bias circuit 2) 2a, 2b, and output powers, is, for example, the same as the relation which is shown in FIG. 11.

According to the high frequency power amplifier of the fifth embodiment, by operating the two bias circuits 2 (or bias circuits 3) successively in accordance with the output power of the amplifier, the same effects as those of the fourth embodiment can be achieved, i.e., an improvement in the power added efficiency at a time of low output power and an improvement in the linearity at a time of maximum output power are achieved. Note that three or more sets of the bias circuit 2 and the amplifier formed by the transistor 21 may be connected in parallel, and the bias circuits 2 may be operated in sequence in accordance with the increase in output power. Therefore, the bias electric current can be set even more finely.

Figure 14:
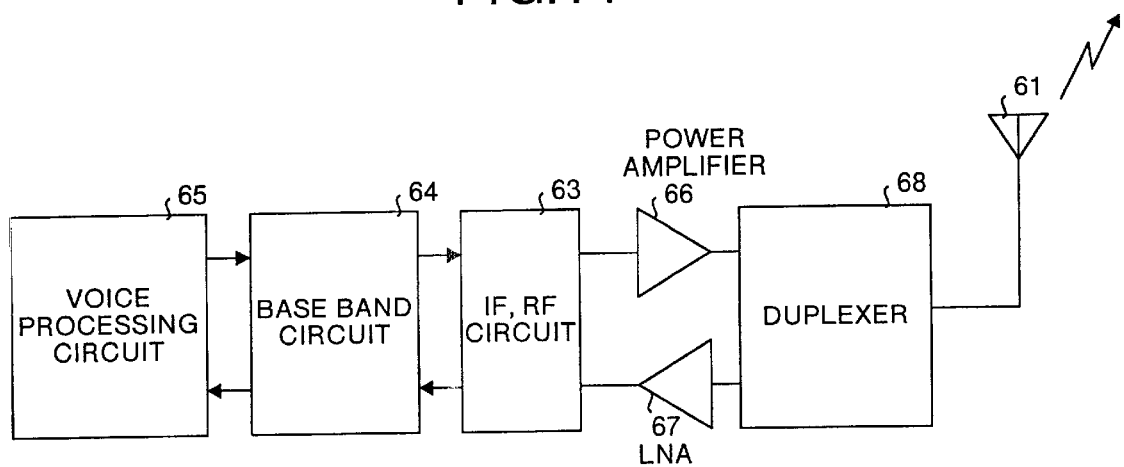
FIG. 14 is a block diagram which illustrates a structure of a communication device relating to a sixth embodiment of the present invention.

FIG. 14 is a block diagram which illustrates a structure of a communication device relating to a sixth embodiment of the present invention. The communication device is equipped with the antenna 61, low noise amplifying circuit (LNA) 67, IF, RF circuit 63, base band circuit 64, voice processing circuit 65, power amplifier 66, and a duplexer 68. The power amplifier 66 is formed by a semiconductor chip which has the high frequency power amplifier according to any of the embodiments which were described above.

As described above, in accordance with the present invention, by providing the transistor for limiting electric current, an electric current limiting means for preventing breaking down due to overcurrent can be realized in a bias circuit. Therefore, there is no need for an electric current cutoff circuit or a resistor for electric current detection which has been provided at the output side of a conventional transistor for amplification. Therefore, it is possible to avoid a deterioration in the power added efficiency. Further, the bias electric current is limited to a constant value or less with respect to the fluctuations in a control signal. Thus, in a case in which the fluctuation in the control signal is large, a stable bias electric current can be obtained. Moreover, fluctuations in the bias electric current with respect to changes in the temperature are less than in the conventional art, and thus, an amplifier which is stable with respect to temperature changes can be obtained. Accordingly, because the design of the peripheral circuits of the amplifier can be simplified, it is possible for a portable communication device to be made more compact and at lower cost.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A high frequency amplifier bias circuit, comprising:
    a control input terminal to which a control signal, to control operations of the high frequency amplifier bias circuit, is input from outside;
    a transistor for bias supply which supplies a bias electric current which corresponds to the control signal to a bias input section of a transistor for amplification; and
    a transistor for limiting electric current which is connected in series to said transistor for bias supply at a node of the bias input section of said transistor for amplification and said transistor for bias supply, and which bypasses an electric current which corresponds to the control signal.

2. The high frequency amplifier bias circuit according to claim 1, further comprising:
    a first transistor for temperature compensation which makes flow an electric current which corresponds to the control signal; and
    a second transistor for temperature compensation which makes flow, via said first transistor for temperature compensation, an electric current which corresponds to the control signal,
    wherein said transistor for limiting electric current makes flow an electric current which corresponds to an electric current which flows through said second transistor for temperature compensation.

3. The high frequency amplifier bias circuit according to claim 2, wherein the size of said transistor for limiting electric current is larger than the size of said second transistor for temperature compensation.

4. The high frequency amplifier bias circuit according to claim 2, further comprising:
    a second control input terminal to which a second control signal is input from outside; and
    a transistor for fine adjustment of bias electric current, which controls an electric current which flows through said first transistor for temperature compensation in accordance with the second control signal.

5. A high frequency power amplifier comprising:
    a transistor for amplification; and
    a bias circuit which supplies a bias electric current to said transistor for amplification, wherein said bias circuit comprises;
    a control input terminal to which a control signal is input from outside,
    a transistor for bias supply which supplies a bias electric current corresponding to the control signal to a bias input section of said transistor for amplification, and
    a transistor for limiting electric current which is connected in series to said transistor for bias supply at a node of the bias input section of said transistor for amplification and said transistor for bias supply, and which bypasses an electric current which corresponds to the control signal.

6. The high frequency power amplifier according to claim 5, wherein said bias circuit further comprises:
    a first transistor for temperature compensation which makes flow an electric current which corresponds to the control signal; and
    a second transistor for temperature compensation which makes flow, via said first transistor for temperature compensation, an electric current which corresponds to the control signal,
    wherein said transistor for limiting electric current makes flow an electric current which corresponds to an electric current which flows through said second transistor for temperature compensation.

7. The high frequency power amplifier according to claim 6, wherein the size of said transistor for limiting electric current is larger than the size of said second transistor for temperature compensation.

8. The high frequency power amplifier according to claim 6, wherein said bias circuit further comprises:
    a second control input terminal to which a second control signal is input from outside; and
    a transistor for fine adjustment of bias electric current, which controls an electric current which flows through said first transistor for temperature compensation in accordance with the second control signal.

9. The high frequency power amplifier according to claim 5, wherein said bias circuit and said transistor for amplification are formed on the same semiconductor substrate.

10. A high frequency power amplifier, comprising:
a transistor for amplification having a bias input section; and
a plurality of bias circuits, each of which supplies a bias electric current to said transistor for amplification, wherein each of said bias circuits comprises:
 a control input terminal to which a control signal is input from outside,
 a transistor for bias supply which supplies a bias electric current corresponding to the control signal to said bias input section of said transistor for amplification, and
 a transistor for limiting electric current which is connected in series to said transistor for bias supply at a node of said bias input section of said transistor for amplification and said transistor for bias supply, and which bypasses an electric current which corresponds to the control signal.

11. The high frequency power amplifier according to claim 10, wherein each of said bias circuits further comprises:
 a first transistor for temperature compensation which makes flow an electric current which corresponds to the control signal; and
 a second transistor for temperature compensation which makes flow, via said first transistor for temperature compensation, an electric current which corresponds to the control signal,
 wherein said transistor for limiting electric current makes flow an electric current which corresponds to an electric current which flows through said second transistor for temperature compensation.

12. The high frequency power amplifier according to claim 11, wherein the size of said transistor for limiting electric current is larger than the size of said second transistor for temperature compensation.

13. The high frequency power amplifier according to claim 11, wherein each said bias circuits further comprises:
 a second control input terminal to which a second control signal is input from outside; and
 a transistor for fine adjustment of bias electric current, which controls an electric current which flows through said first transistor for temperature compensation in accordance with the second control signal.

14. The high frequency power amplifier according to claim 10, wherein said bias circuit and said transistor for amplification are formed on the same semiconductor substrate.

15. A high frequency power amplifier comprising:
a plurality of amplifiers connected in parallel, each amplifier comprising:
 a transistor for amplification having a bias input section; and
 a bias circuit which supplies a bias electric current to said transistor for amplification, wherein said bias circuit includes:
  a control input terminal to which a control signal is input from outside,
  a transistor for bias supply which supplies a bias electric current corresponding to the control signal to said bias input section of the corresponding transistor for amplification, and
  a transistor for limiting electric current which is connected in series to said transistor for bias supply at a node of said bias input section of said corresponding transistor for amplification and said transistor for bias supply, and which bypasses an electric current which corresponds to the control signal.

16. The high frequency power amplifier according to claim 15, wherein said bias circuit further comprises:
 a first transistor for temperature compensation which makes flow an electric current which corresponds to the control signal; and
 a second transistor for temperature compensation which makes flow, via said first transistor for temperature compensation, an electric current which corresponds to the control signal,
 wherein said transistor for limiting electric current makes flow an electric current which corresponds to an electric current which flows through said second transistor for temperature compensation.

17. The high frequency power amplifier according to claim 16, wherein the size of said transistor for limiting electric current is larger than the size of said second transistor for temperature compensation.

18. The high frequency power amplifier according to claim 16, wherein said bias circuit comprises:
 a second control input terminal to which a second control signal is input from outside; and
 a transistor for fine adjustment of bias electric current, which controls an electric current which flows through said first transistor for temperature compensation in accordance with the second control signal.

19. The high frequency power amplifier according to claim 15, wherein said bias circuit and said transistor for amplification are formed on a common semiconductor substrate.

20. A communication device, comprising:
in an RF front end circuit, a high frequency power amplifier in which a transistor for amplification having a bias input section and a bias circuit, which supplies bias electric current to said transistor for amplification, are formed on a common semiconductor substrate, wherein said bias circuit comprises:
 a control input terminal to which a control signal, to control operations of the high frequency amplifier bias circuit, is input from outside,
 a transistor for bias supply which supplies a bias electric current, corresponding to the control signal, to said bias input section of said transistor for amplification, and
 a transistor for limiting electric current which is connected in series to said transistor for bias supply at a node of said bias input section of said transistor for amplification and said transistor for bias supply, and which bypasses an electric current which corresponds to the control signal.

21. The communication device according to claim 20, wherein said bias circuit further comprises:
 a first transistor for temperature compensation which makes flow an electric current which corresponds to the control signal; and
 a second transistor for temperature compensation which makes flow, via said first transistor for temperature compensation, an electric current which corresponds to the control signal,
 wherein said transistor for limiting electric current makes flow an electric current which corresponds to an electric current which flows through said second transistor for temperature compensation.

22. The communication device according to claim 21, wherein the size of said transistor for limiting electric current is larger than the size of said second transistor for temperature compensation.

23. The communication device according to claim 21, wherein each bias circuit further comprises:

a second control input terminal to which a second control signal is input from outside; and a transistor for fine adjustment of bias electric current, which controls an electric current which flows through said first transistor for temperature compensation in accordance with the second control signal.

24. A communication device, comprising:

in an RF front end circuit, a high frequency power amplifier in which a transistor for amplification and having a bias input section and a plurality of bias circuits which supply bias electric current to said transistor for amplification are formed on a common semiconductor substrate, wherein each of said bias circuits comprises:
a control input terminal to which a control signal to control operations of the high frequency amplifier bias circuit is input from outside;
a transistor for bias supply which supplies a bias electric current corresponding to the control signal to said bias input section of said transistor for amplification; and
a transistor for limiting electric current which is connected in series to said transistor for bias supply at a node of said bias input section of said transistor for amplification and said transistor for bias supply, and which bypasses an electric current which corresponds to the control signal.

25. The communication device according to claim 24, wherein said bias circuit further comprises:
a first transistor for temperature compensation which makes flow an electric current which corresponds to the control signal; and
a second transistor for temperature compensation which makes flow, via said first transistor for temperature compensation, an electric current which corresponds to the control signal,
wherein said transistor for limiting electric current makes flow an electric current which corresponds to an electric current which flows through said second transistor for temperature compensation.

26. The communication device according to claim 25, wherein the size of said transistor for limiting electric current is larger than the size of said second transistor for temperature compensation.

27. The communication device according to claim 25, wherein each bias circuit further comprises:
a second control input terminal to which a second control signal is input from outside; and
a transistor for fine adjustment of bias electric current, which controls an electric current which flows through said first transistor for temperature compensation in accordance with the second control signal.

28. A communication device, comprising:

in an RF front end circuit, a high frequency power amplifier in which a plurality of amplifiers are connected in parallel, each of said amplifiers being provided with a transistor for amplification having a bias input section and a bias circuit which supplies bias electric current to said transistor for amplification, said amplifiers being formed on a common semiconductor substrate, wherein each bias circuit comprises:
a control input terminal to which an input signal is input from outside;
a transistor for bias supply which supplies a bias electric current corresponding to the control signal to said bias input section of the corresponding transistor for amplification; and
a transistor for limiting electric current which is connected in series to said transistor for bias supply at a node of said bias input section of said corresponding transistor for amplification and said transistor for bias supply, and which bypasses an electric current which corresponds to the control signal.

29. The communication device according to claim 28, wherein each said bias circuit further comprises:
a first transistor for temperature compensation which makes flow an electric current which corresponds to the control signal; and
a second transistor for temperature compensation which makes flow, via said first transistor for temperature compensation, an electric current which corresponds to the control signal,
wherein said transistor for limiting electric current makes flow an electric current which corresponds to an electric current which flows through said second transistor for temperature compensation.

30. The communication device according to claim 29, wherein the size of said transistor for limiting electric current is larger than the size of said second transistor for temperature compensation.

31. The communication device according to claim 29, wherein each said bias circuit further comprises:
a second control input terminal to which a second control signal is input from outside; and
a transistor for fine adjustment of bias electric current, which controls an electric current which flows through said first transistor for temperature compensation in accordance with the second control signal.

* * * * *

UNITED STATES PATENT AND TRADEMARK OFFICE
CERTIFICATE OF CORRECTION

PATENT NO. : 6,566,954 B2  Page 1 of 1
DATED : May 20, 2003
INVENTOR(S) : Naoyuki Miyazawa It is certified that error appears in the above-identified patent and that said Letters Patent is hereby corrected as shown below:

<u>Column 10,</u>
Line 25, change ";" to -- : --.

Signed and Sealed this

Seventh Day of October, 2003

JAMES E. ROGAN
*Director of the United States Patent and Trademark Office*